(12) United States Patent
Kawaguchi et al.

(10) Patent No.: US 9,742,080 B2
(45) Date of Patent: Aug. 22, 2017

(54) ELECTRIC JUNCTION BOX

(75) Inventors: Kiyofumi Kawaguchi, Yokkaichi (JP); Osamu Aoki, Yokkaichi (JP); Shunji Taga, Yokkaichi (JP); Shunsuke Amagai, Kanagawa (JP)

(73) Assignees: SUMITOMO WIRING SYSTEMS, LTD., Mie (JP); NISSAN MOTOR CO., LTD., Kanagawa (JP)

( * ) Notice: Subject to any disclaimer, the term of this patent is extended or adjusted under 35 U.S.C. 154(b) by 623 days.

(21) Appl. No.: 13/231,218

(22) Filed: Sep. 13, 2011

(65) Prior Publication Data
US 2012/0064741 A1    Mar. 15, 2012

(30) Foreign Application Priority Data

Sep. 15, 2010  (JP) ................. 2010-207080
Mar. 23, 2011  (JP) ................. 2011-064209

(51) Int. Cl.
    H01R 12/00   (2006.01)
    H01R 9/22    (2006.01)
    H05K 5/00    (2006.01)

(52) U.S. Cl.
    CPC ........... H01R 9/226 (2013.01); H05K 5/0026 (2013.01)

(58) Field of Classification Search
    CPC ..................... H01R 9/226; H05K 5/0026
    USPC ....... 439/76.2, 638, 949, 251, 687, 696, 731
    See application file for complete search history.

(56) References Cited

U.S. PATENT DOCUMENTS

| | | | |
|---|---|---|---|
| 6,870,097 B2 * | 3/2005 | Oda | ................................ 174/50 |
| 6,919,509 B2 | 7/2005 | Oda | |
| 7,364,438 B2 * | 4/2008 | Sasaki et al. | ................ 439/76.1 |
| 2005/0013095 A1 | 1/2005 | Oda | |

FOREIGN PATENT DOCUMENTS

| | | |
|---|---|---|
| JP | 09-266018 | 10/1997 |
| JP | 09-284952 | 10/1997 |
| JP | 11-262136 | 9/1999 |
| JP | 2005-039879 | 2/2005 |
| JP | 2005-39888 | 2/2005 |
| JP | 2008-283760 | 11/2008 |
| JP | 2010-57305 | 3/2010 |
| JP | 2010-220365 | 9/2010 |

OTHER PUBLICATIONS

Japan Office action, dated Mar. 2, 2015 along with an English translation thereof.

* cited by examiner

Primary Examiner — Felix O Figueroa
(74) Attorney, Agent, or Firm — Greenblum & Bernstein, P.L.C.

(57) ABSTRACT

A first case is integrally provided with a connection housing open to a side of the first case. A second case is integrally provided with a support base projecting toward the first case and facing inside the connection housing from a window provided in the connection housing. A bus bar included in a connection terminal disposed inside the connection housing is provided along the support base and is interposed between the support base and the first case, and is positioned in a projecting direction of the connection terminal.

10 Claims, 8 Drawing Sheets

ELECTRIC JUNCTION BOX

CROSS-REFERENCE TO RELATED APPLICATIONS

The present application claims priority under 35 U.S.C. §119 of Japanese Applications No. 2010-207080, filed on Sep. 15, 2010, and No. 2011-064209, filed on Mar. 23, 2011, which are herein expressly incorporated by reference in their entireties.

BACKGROUND OF THE INVENTION

1. Field of the Invention

The present invention relates to an electric junction box mounted in a vehicle and the like, particularly to an electric junction box provided with a connection housing, such as a connector housing, open to a side of the electric junction box.

2. Description of Related Art

For efficient electric wirings and improvement in maintenance, electric junction boxes, such as junction boxes and relay boxes, have conventionally been used in electric systems of vehicles and the like. In general, such an electric junction box has a structure in which conductive members, such as a bus bar, that form an internal circuit are provided in an electric junction box main body having an hollow box shape composed of an upper case and a lower case combined with each other on an opening side. A plurality of connection housings are provided open to an upper surface and a lower surface of the electric junction box main body, the connection housings being provided therein with projecting connection terminals provided on bus bars. External electric components, such as connectors, fuses, and relays, are mounted and connected to the internal circuit.

With recent demands for downsizing and space saving, it is necessary to provide the connection housing open to a side surface of the electric junction box main body where the upper case and the lower case are combined, in addition to the upper surface and the lower surface of the electric junction box main body, so as to allow assembly of connectors of electric cable terminals and the like in a vehicle and to enhance the space efficiency of the electric junction box. In order to meet such demands, it is proposed that a housing half body is integrally provided to a peripheral wall of each of an upper case and a lower case and that the housing half bodies are combined as the peripheral walls are combined, and thereby a connection housing is provided open to a side surface of an electric junction box main body. Alternatively, Japanese Patent Laid-open Publication No. 2008-283760 discloses, for example, that a separately provided tubular connection housing is interposed between peripheral walls of an upper case and a lower case, and thereby a connection housing is provided open to a side surface of an electric junction box main body.

However, the connection housing having a divided structure that straddles the upper case and the lower case has a clearance in a locking portion of the cases. With an external force or vibration exerted, the cases may thus be displaced from each other, and the connection housing may deform. Such a deformation of the connection housing causes a displacement between the connection housing and a connection terminal projecting inside, thus possibly causing an electric component to hook as being mounted or causing difficulty in mounting. In addition, such a deformation of the connection housing causes instability of an electric component mounted inside the housing, thus leading to wear and damage of the electric component and the electric junction box as well as possibly causing a serious defect, such as a connection failure.

In the structure disclosed in Japanese Patent Laid-open Publication No. 2008-283760, it is necessary to interpose the separate connection housing between the peripheral walls of the upper case and the lower case, thus causing unfavorable conditions, such as an increase in the number of components, a complex structure, and a complicated assembly. Due to a certain clearance in the portion interposing the separate connection housing, in particular, the instability of the connection housing associated with the displacement of the cases cannot be completely solved. Thus, circumstances possibly remain to arise, such as a contact failure stemming from displacement with a contact portion.

SUMMARY OF THE INVENTION

In view of the circumstances above, the present invention provides an electric junction box having a novel structure that ensures shape stability of a connection housing open to a side of the electric junction box and secures connection stability of an electric component mounted therein in a simple structure without an increase in the number of components.

A first aspect of the present invention provides an electric junction box having an electric junction box main body composed of a first case and a second case combined with each other in which a bus bar is housed, a connection terminal is integrally provided with the bus bar, and, in a connection housing open to a side of the electric junction box main body orthogonal to a combining direction of the first case and the second case, the connection terminal projects toward an opening direction. The first case is integrally provided with the connection housing open to the side of the first case. The second case is integrally provided with a support base projecting toward the first case and facing inside the connection housing from a window provided in the connection housing. The bus bar included in the connection terminal disposed inside the connection housing is provided along the support base and is interposed between the support base and the first case, and thereby is positioned in a projecting direction of the connection terminal.

According to the first aspect, in the case where it is necessary to provide the connection housing open to the side of the electric junction box main body where the first case and the second case are combined, the connection housing open to the side of the first case is integrally provided only to the first case. Compared with a case where a connection housing straddles a first case and a second case, the connection housing does not deform due to displacement of the cases caused by a clearance at a locking portion between the cases. Thus, problems can be prevented, such as inconvenience in mounting an electric component due to such deformation of the connection housing, and wear and damage of a mounted electric component and a contact failure due to instability between the cases.

In particular, integrally providing the connection housing open to the side to one of the cases ensures shape stability of the connection housing open to the side, and thus connection stability, with a fewer number of components, compared with a conventional structure in which a separate connection housing is interposed between peripheral walls of cases.

Furthermore, the support base, which integrally projects from the second case, is inserted into the connection housing through the window in the connection housing, and the connection terminal of the bus bar on the support base is disposed inside the connection housing. Thus, the connection terminal can be suitably housed and disposed inside the connection housing while the entire rigidity of the integrally provided connection housing is sufficiently secured. In addition, the window of the connection housing can be covered by the support base of the second housing without using a separate component, thus preventing an increase in the number of components and sufficiently ensuring connection stability of an electric component.

A portion of the bus bar disposed along the support base is interposed between the support base and the first case and is positioned in the projecting direction of the connection terminal. Thus, a force to insert or remove an electric component exerted on the connection terminal, which is a problem with the connection housing open to the side, can be borne by the holding portion of the bus bar in contact with the both cases. Thereby, deformation of the connection terminal and adverse impact to other portions due to insertion/removal force of the electric component can be practicably prevented by utilizing the assembly of the both cases, without requiring integral molding of the connection terminal to the case or a separate holding component.

A second aspect of the present invention provides the electric junction box according to the first aspect, in which the support base projects inside the connection housing on a bottom side opposite to the opening side of the connection housing; and the bus bar is interposed between the connection housing and the support base in the connection housing, and thereby the connection terminal is positioned in the projecting direction of the connection terminal and the projecting direction of the support base.

According to the second aspect, the bus bar is interposed between the connection housing and the support base in the projecting direction of the connection terminal and the projection direction of the support base, and thereby the connection terminal is positioned. Accordingly, the connection terminal can be positioned and held in the housing in a more stable manner, thus further enhancing the connection reliability and stability in the connection housing.

A third aspect of the present invention provides the electric junction box according to the second aspect, in which the bus bar is interposed between the connection housing and the support base in the projecting direction of the support base; at least one of the connection housing and the support base is provided with a positioning projection extending in the projecting direction of the support base; the positioning projection penetrates a through-hole in the bus bar and projects; and a projecting end portion of the positioning projection is fitted to a fitting recess in one of the remaining connection housing and the support base.

According to the third aspect, the positioning projection is engaged with the through-hole in the bus bar, thus securing positioning and holding of the bus bar omnidirectionally around the positioning projection. Thereby, the connection terminal can be positioned in the housing in a more secure and stable manner. Furthermore, the projecting end portion of the positioning projection on at least either of the connection housing or the support base is engaged with the fitting recess in the remaining connection housing or support base. Thus, positioning of the bus bar and mutual positioning of the support base and the connection housing can be achieved by using the common positioning projection, thus allowing further accurate positioning of the connection terminal in the connection housing. In addition, the positioning projection extends in the projecting direction of the support base, namely, the direction orthogonal to the projecting direction of the connection terminal. Thus, the bus bar can be held stably against the horizontal insertion/removal force exerted on the connection terminal in the connection housing open to the side. Accordingly, the strength against insertion/removal force, which is an issue with the side connection housing, can be advantageously ensured while the positioning accuracy is enhanced.

A fourth aspect of the present invention provides the electric junction box according to the second or third aspect, in which at least one of the connection housing and the support base interposing the bus bar is provided with a press-fit rib; and the press-fit rib is press-fitted to the bus bar and the bus bar is held between the connection housing and the support base.

According to the fourth aspect of the present invention, the press-fit rib is provided to absorb the size tolerance of the bus bar, the first case, and the support base, and thus the bus bar can be securely held between the connection housing and the support base. Accordingly, the connection terminal is prevented from being unstable, and is positioned in the connection housing in a more secure and stable manner.

A fifth aspect of the present invention provides the electric junction box according to one of the first to fourth aspects, in which the connection housing has a rectangular tubular portion open to the side; and the window is provided in a position distant from a corner of the tubular portion.

According to the fifth aspect of the present invention, the window in the connection housing is provided distant from the corner of the tubular portion. Thus, the reinforcement effect of the corner of the tubular portion can minimize a decline in shape stability of the connection housing due to forming of the open window.

According to the present invention, the connection housing open to the side is integrally provided to the first case; the support base integrally projecting from the second case is inserted through the window in the connection housing; and thus the connection terminal of the bus bar on the support base is disposed inside the connection housing. Accordingly, the electric junction box can be provided including the side-open connection housing having enhanced shape stability and connection stability with a fewer number of components.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein:

FIG. 12 is an enlarged front view of the main portion of the electric junction box shown in

FIG. 9;

DETAILED DESCRIPTION OF PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The embodiments of the present invention are explained below with reference to the drawings.

Figure 1:
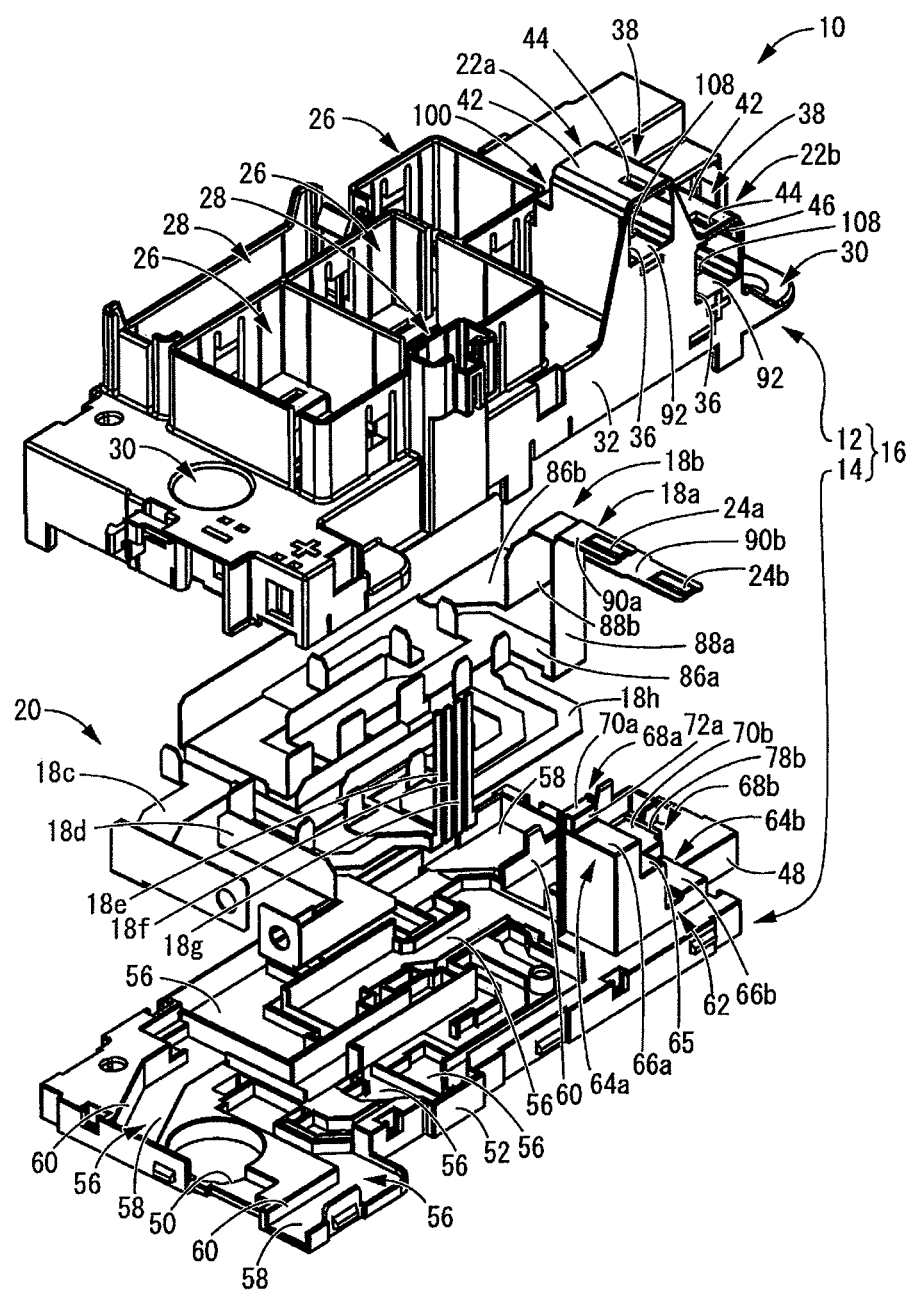
FIG. 1 is an exploded perspective view of an electric junction box according to a first embodiment of the present invention.

FIG. 1 is an exploded perspective view of an electric junction box 10 according to a first embodiment of the present invention. As shown in FIG. 1, the electric junction box 10 has an upper case 12 as a first case and a lower case 14 as a second case. The upper case 12 and the lower case 14 are combined with each other in a vertical direction in FIG. 1 to form an electric junction box main body 16. Inside the electric junction box main body 16, a plurality of bus bars 18a to 18h are housed between the upper case 12 and the lower case 14, and thereby a conductive circuit 20 is provided. Furthermore, a plurality of connection housings 22a and 22b each open to a side are provided in the electric junction box main body 16. Connection terminals 24a and 24b project inside the connection housing 22a and 22b, respectively, the connection terminals 24a and 24b being integrally provided in front end portions of the bus bars 18a and 18b, respectively.

Figure 2:
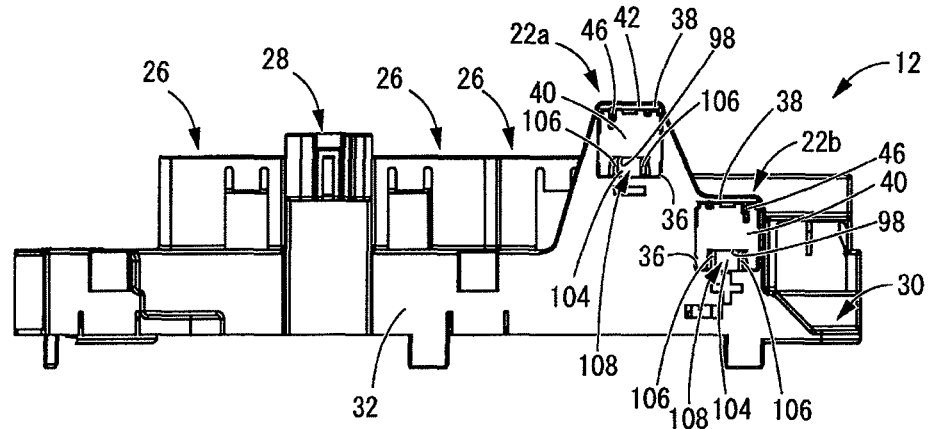
FIG. 2 is a front view of an upper case included in the electric junction box shown in FIG. 1.

More specifically, the upper case 12 composed of a synthetic resin, or other suitable material, has a rectangular box shape open to the lower case 14. A plurality of relay mounting portions 26 and connector mounting portions 28 are provided on an upper surface of the upper case 12, as shown in FIG. 1. A plurality of bolt inserting portions 30 are provided in an external peripheral portion of the upper case 12. As shown in FIG. 2, the upper case 12 is provided with a peripheral wall 32 cylindrically extending toward the lower case 14 from the peripheral portion of the upper surface.

The upper case 12 is integrally provided with the two connection housings 22a and 22b open to the side of the upper case 12. Specifically, the connection housings 22a and 22b are open in the horizontal direction orthogonal to the vertical direction in which the upper case 12 and the lower case 14 are combined. Each of the connection housings 22a and 22b has a tubular portion 38 extending horizontally (back side in a direction orthogonal to the paper surface of FIG. 2) in a rectangular tubular shape from an opening 36 open to the peripheral wall 32 of the upper case 12. A rectangular bottom wall 40 is provided in an end portion of the tubular portion 38 on the bottom side (back side) opposite to the opening 36 side.

Connectors (not shown in the drawings) are mounted horizontally from the side of the upper case 12 in the connection housings 22a and 22b. Thus, an engagement window 44 to which a locking portion of a connector is engaged is provided in an upper wall 42 of the tubular portion 38 of each of the connection housings 22a and 22b (refer to FIG. 1). A positioning projection 46 is provided to the upper wall 42 for mutual engagement between the tubular portion 38 and the connector. The connection housings 22a and 22b have a substantially similar structure as described above. The connection housing 22b is provided, however, in a lower position slightly more proximate to the lower case 14.

Figure 3:
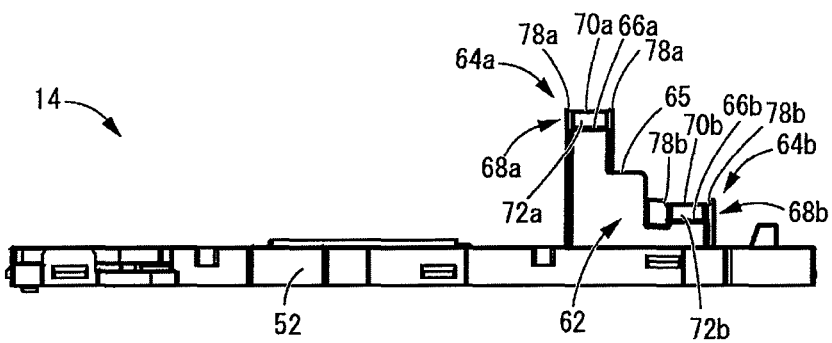
FIG. 3 is a front view of a lower case included in the electric junction box shown in FIG. 1.
Figure 4:
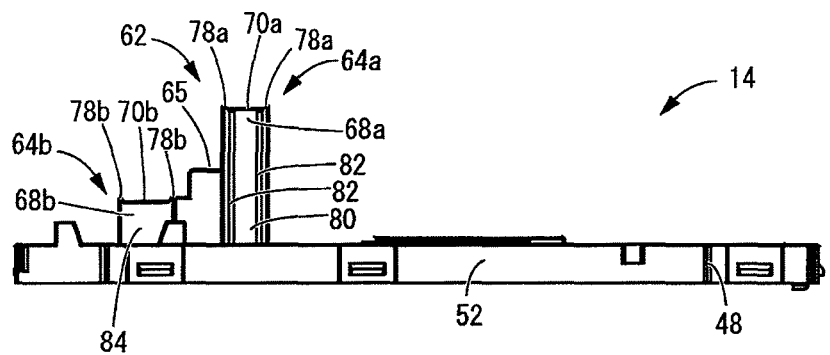
FIG. 4 is a rear view of the lower case included in the electric junction box shown in FIG. 1.
Figure 5:
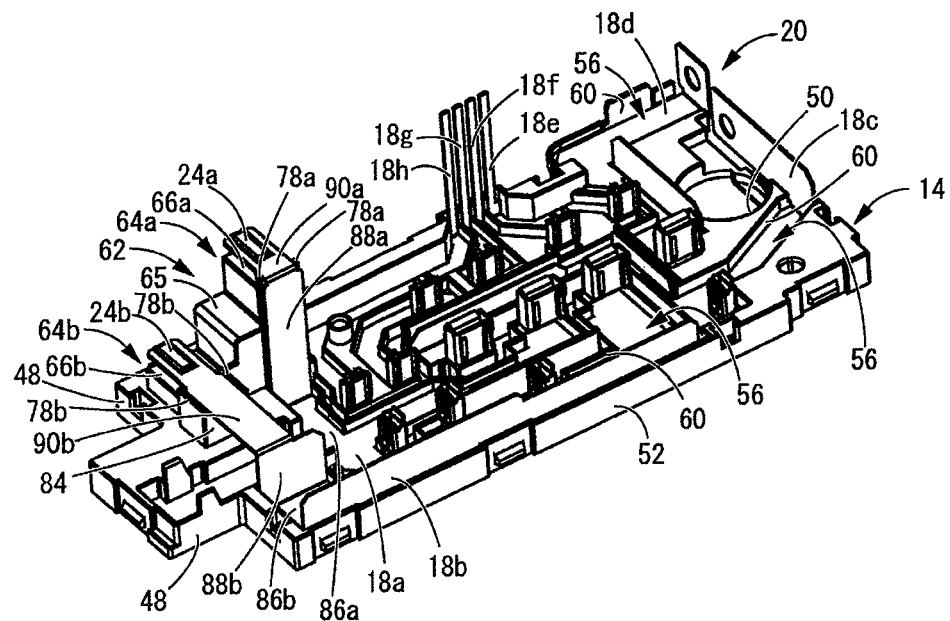
FIG. 5 is a perspective view of the lower case and a bus bar included in the electric junction box shown in FIG. 1 from the rear side of the lower case.
Figure 6:
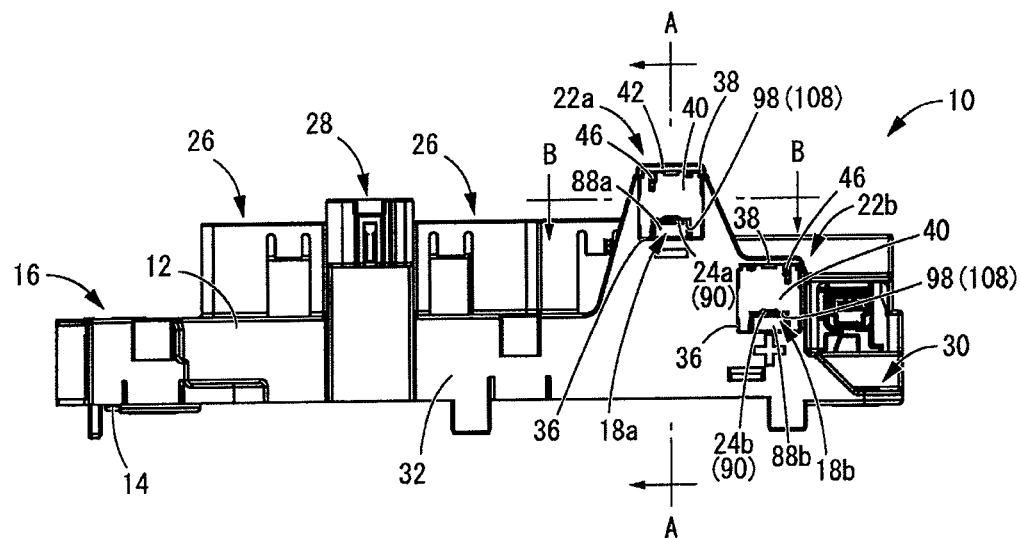
FIG. 6 is a front view of the electric junction box shown in FIG. 1 in an assembled state.

The lower case 14, which is composed of a synthetic resin similar to the upper case 12, or other suitable material, has a substantially rectangular flat plate shape, as shown in FIGS. 3 to 5. In FIG. 5, the bus bars 18a to 18h to be mounted in the lower case 14 are also illustrated. Cutouts 48 and through-holes 50 are provided in an external peripheral portion of the lower case 14 in locations corresponding to the bolt inserting portions 30 of the upper case 12.

A plurality of bus bar mounting portions 56 are provided on an upper surface of the lower case 14. Each of the bus bar mounting portions 56 is formed to fit the shape of each of the bus bars 18a to 18h, and has a groove shape defined by a bottom surface 58 and a housing wall 60, such that a first flat plate 86 of each of the bus bars 18a to 18h hereinafter described is housed in a positioned state (refer to FIG. 1).

A projection 62 having a stepped block shape as a whole is integrally provided on the upper surface of the lower case 14, the projection 62 projecting in an upward direction from which the upper case 12 is combined. The projection 62 has a structure in which an upward projecting first support base 64a (left side in FIG. 3) and an upward projecting second support base 64b (right side in FIG. 3) are integrally connected through a stepped connecting portion 65 provided therebetween, the first support base 64a being the highest projection and having a substantially rectangular cross-sectional shape, the second support base 64b being the lowest projection and having a substantially rectangular cross-sectional shape.

In a projecting front end portion of the support base 64a projecting from the lower case 14 toward the upper case 12, a flat surface 66a is provided on a forward end side proximate to an external peripheral wall 52, as shown in FIG. 1. A holding projection 68a is provided on a rear end side of the flat surface 66a distant from the external peripheral wall 52, the holding projection 68a projecting more upward than the flat surface 66a. A support flat surface 70a is provided in a projecting front end surface of the holding projection 68a. A stepped surface 72a extending in the vertical direction is provided between the flat surface 66a and the support flat surface 70a. A pair of support ribs 78a project upward on two sides in the width direction of the support flat surface 70a.

A back surface 80 on the rear side of the support base 64a extends straight in a band shape from the support flat surface 70a to the upper surface of the lower case 14. As shown in FIG. 4, a pair of side end support ribs 82 project along an entire length of the back surface 80 proximate to two sides in the width direction of the back surface 80.

The support base 64b has a substantially similar structure to the above-described support base 64a, but has a partially different structure on a rear end side. Specifically, similar to the support base 64a, a projecting front end portion of the support base 64b is provided with a flat surface 66b on a forward end side and a holding projection 68b on the rear end side, and a support flat surface 70b is provided in the projecting front end surface (refer to FIG. 1). The support flat surface 70b of the support base 64b extends more rearward than the support flat surface 70b of the support base 64a. A back surface 84 of the support base 64b extends straight from the support flat surface 70b to the upper surface of the lower case 14. The back surface 84 is merely a flat surface without a pair of side end support ribs 82.

The plurality of bus bars 18a to 18h housed in the electric junction box main body 16 have a variety of shapes, as shown in FIGS. 1 and 5. A total of eight bus bars 18a to 18h are used to form the conductive circuit 20 in the present embodiment. The bus bars 18a to 18h are each provided by press-punching and bending a flat metal plate into a predetermined shape.

The connection terminal 24a is integrally provided in one end portion of the bus bar 18a, the connection terminal 24a projecting inside the connection housing 22a for external conduction. The connection terminal 24a is a tab terminal having an uneven surface in the present embodiment. The bus bar 18a has a first flat plate 86a extending horizontally in a substantially band shape and housed in the bus bar mounting portion 56 of the lower case 14. The first flat plate 86a has a planar shape similar to that of the bottom surface 58 of the bus bar mounting portion 56, and is housed in the bus bar mounting portion 56 in a positioned state. An end portion of the first flat plate 86a in which the connection terminal 24a is provided is bent in a crank shape. A perpendicular portion 88a extending perpendicularly orthogonal to an extending direction of the first flat plate 86a and the connection terminal 24a is integrally provided therebetween. A second flat plate 90a extending horizontally orthogonal to the perpendicular portion 88a is provided in an upper end portion of the perpendicular portion 88a. The connection terminal 24a is provided in a front end portion of the second flat plate 90a.

Similar to the bus bar 18a, the bus bar 18b is integrally provided in one end portion with the connection terminal 24b projecting in the connection housing 22b. Substantially similar to the bus bar 18a, the bus bar 18b has a first flat plate 86b, a perpendicular portion 88b, and a second flat plate 90b. The connection terminal 24b of the connection housing 22b is provided in a front end portion of the second flat plate 90b. The perpendicular portion 88b of the bus bar 18b is shorter than the perpendicular portion 88a of the bus bar 18a. The second flat plate 90b of the bus bar 18b is positioned lower than the second flat plate 90a of the bus bar 18a. The second flat plate 90b of the bus bar 18b extends more than the second flat plate 90a of the bus bar 18a.

The upper case 12, the lower case 14, and the bus bars 18a to 18h configured as above are assembled to one another as described below to provide the electric junction box 10.

As shown in FIG. 5, the bus bars 18a to 18h are first mounted in the respective bus bar mounting portions 56 of the lower case 14. The first flat plates 86a and 86b of the bus bars 18a and 18b, respectively, are overlapped on the bottom surfaces 58 of the bus bar mounting portions 56 and housed therein. The perpendicular portions 88a and 88b and the second flat plates 90a and 90b are provided along the support bases 64a and 64b, respectively. Specifically, the perpendicular portion 88a of the bus bar 18a is overlapped on the back surface 80 of the support base 64a. Then, the perpendicular portion 88a is overlapped between the pair of side end support ribs 82 on the back surface 80 so as to be positioned. A base end portion of the second flat plate 90a of the bus bar 18a is mounted on the support flat surface 70a of the support base 64a and is supported by the pair of support ribs 78a on the two sides in the width direction in a positioned state. The connection terminal 24a projecting from the front end portion of the second flat plate 90a of the bus bar 18a is provided distant above the flat surface 66a and extending toward the forward end side of the flat surface 66a in a position above the flat surface 66a. The connection terminal 24a extends to substantially the same position as that of the forward end portion of the flat surface 66a of the support base 64a, but does not project from the end surface of the support base 64a.

Substantially similar to the bus bar 18a, the bus bar 18b is also mounted in the lower case 14 and the first flat plate 86b of the bus bar 18b is housed in the bus bar mounting portion 56. With the bus bar 18b, however, the perpendicular portion 88b is not overlapped on the back surface 84 of the support base 64b and extends upward while being overlapped on the housing wall 60 of the bus bar mounting portion 56. The second flat plate 90b of the bus bar 18b extends horizontally toward the connection terminal 24b in a state in which a vicinity of a portion connected to the perpendicular 88b is not supported by the lower case 14. An intermediate portion in the length direction of the second flat plate 90b is mounted on the support flat surface 70b of the support base 64b. The support flat surface 70b of the support base 64b is longer than the support base 64a in an anteroposterior direction of the support base 64b. Thus, the second flat plate 90b of the bus bar 18b is mounted on the support flat surface 70b of the support base 64b in a wider area. The mounted second flat plate 90b is supported in a state in which the two sides in the width direction are positioned by the pair of long support ribs 78b on the support flat surface 70b. Similar to the bus bar 18a, the connection terminal 24b projecting from the front end side of the second flat plate 90b of the bus bar 18b is provided distant above the flat surface 66b and extending toward the forward end side of the flat surface 66b in a position above the flat surface 66b.

The upper case 12 is placed from above on the lower case 14 in which the bus bars 18a to 18h are mounted, and the lower case 14 is covered (refer to FIG. 1). The lower case 14 and the upper case 12 are vertically combined with each other as described above, and thereby the electric junction box main body 16 is provided having a hollow box structure. The conductive circuit 20 is formed by the bus bars 18a to 18h in the electric junction box main body 16. The bolt inserting portions 30 of the upper case 12 are fitted into the cutouts 48 and the through-holes 50 in the lower case 14 and are exposed directly to the lower surface of the electric junction box main body 16. In combining of the upper case 12 and the lower case 14, the peripheral wall 32 of the upper case 12 is placed so as to cover the external peripheral wall 52 of the lower case 14 from the outside, thus providing a peripheral wall portion of the electric junction box main body 16.

In the state in which the upper case 12 and the lower case 14 are vertically combined with each other as described above, the connection housings 22a and 22b provided on the side of the upper case 12 are open horizontally on the side surface of the electric junction box main body 16. In the connection housings 22a and 22b, the connection terminals 24a and 24b integrally provided to the bus bars 18a and 18b, respectively, are housed and projected from the bottom wall 40 toward the opening 36. Since the connection terminals 24a and 24b are substantially similarly provided and structured in the connection housings 22a and 22b, respectively, the structure is explained in detail with respect to the connection housing 22a and explanations of the connection housing 22b are omitted.

Figure 7:
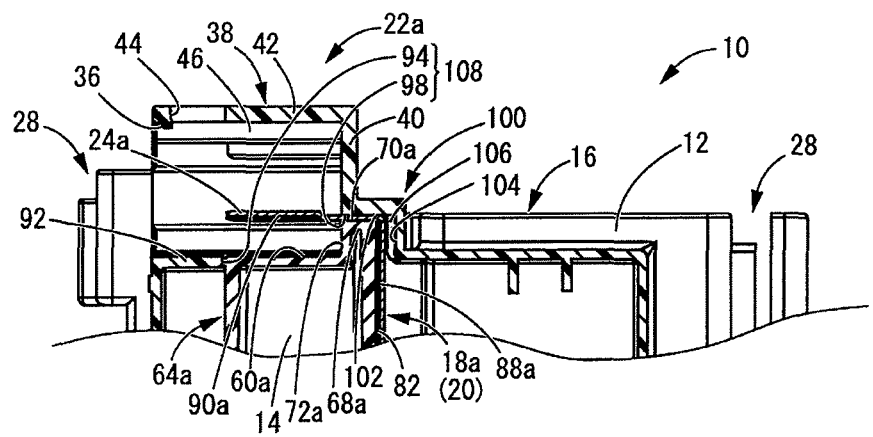
FIG. 7 is an enlarged cross-sectional view of a main portion in FIG. 6 along A-A.
Figure 8:
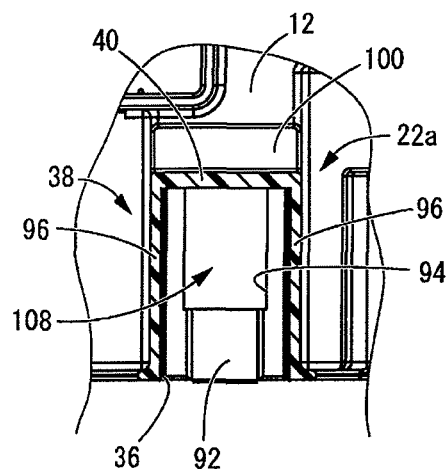
FIG. 8 is an enlarged cross-sectional view of only the upper case in the main portion in FIG. 6 along B-B.

FIGS. 7 and 8 are enlarged cross-sectional views of the connection housing 22a. To facilitate understanding, FIG. 8 illustrates only the upper case 12, omitting the bus bar 18a and the lower case 14. A lower wall 92 of the tubular portion 38 of the connection housing 22a has a rectangular shape. A rectangular lower window 94 is open in a central portion in the width direction on the back side of the lower wall 92. The lower window 94 does not reach end portions on two sides in the width direction (two sides in the left-right direction in FIG. 8) of the lower wall 92. Namely, the lower window 94 is provided distant from a corner 96 of the tubular portion 38, which is an external edge portion of the lower wall 92.

A bottom window 98 is provided in the bottom wall 40 of the tubular portion 38. The bottom window 98, which extends from the lower window 94, has the same width as the lower window 94 and is open only in the central portion in the width direction below the bottom wall 40. Namely, the bottom window 98 is provided distant from the corner 96 of the tubular portion 38, which is an external edge portion of the bottom wall 40. As shown in FIG. 7, a housing portion 100 is provided on the further back side (right side in FIG. 7) from the opening end portion of the bottom window 98 of the connection housing 22a. The housing portion 100 is provided with a horizontal support wall surface 102 and a perpendicular support wall surface 104, the horizontal support wall surface 102 extending horizontally from the opening end portion above the bottom window 98, the perpendicular support wall surface 104 extending vertically from the end portion of the horizontal support wall surface 102. A pair of vertical portion support ribs 106 are provided on the perpendicular support wall surface 104, the vertical portion support ribs 106 extending perpendicularly in the vertical direction in parallel to each other.

In the present embodiment, a window 108 of the connection housing 22a is formed by the lower window 94 and the bottom window 98 open in the tubular portion 38. The support base 64a of the lower case 14 is inserted from below to a position corresponding to the window 108. At this time, the second flat plate 90a of the bus bar 18a mounted on the support base 64a is inserted inside the tubular portion 38 through the window 108. The lower case 14 and the upper case 12 are completely combined, and then the window 108 open in the tubular portion 38 of the connection housing 22a is covered by the support base 64a. Specifically, the flat surface 66a of the support base 64a and the stepped surface 72a are fitted to the lower window 94 and the bottom window 98, respectively, in a state in which they are exposed toward the internal space of the connection housing 22a. Thereby, the window 108 is completely covered, and a rectangular tubular internal wall surface is continuously provided along an entire surface on the internal peripheral surface of the tubular portion 38. In the present embodiment, the lower wall 92 of the tubular portion 38 and the flat surface 66a of the support base 64a are flush with each other, and the bottom wall 40 of the tubular portion 38 and the stepped surface 72a are flush with each other with the bus bar 18a therebetween.

Inside the tubular portion 38 of the connection housing 22a, the front end portion of the second flat plate 90a of the bus bar 18a projects between the bottom wall 40 and the stepped surface 72a and extends toward the internal space of the tubular portion 38. The front end portion of the second flat plate 90a is exposed to the internal space of the tubular portion 38, and thereby the connection terminal 24a of the bus bar 18a projects horizontally toward the opening 36 of the connection housing 22a.

The holding projection 68a on the rear end side of the support base 64a is housed in the housing portion 100 of the connection housing 22a. Thus, the holding projection 68a of the support base 64a projects inside the connection housing 22a on the bottom side, which is opposite to the opening 36 side of the connection housing 22a. The base end portion of the second flat plate 90a, which is included in one end portion of the bus bar 18a, is vertically held between the holding projection 68a and the connection housing 22a. Specifically, the front surface of the base end portion of the second flat plate 90a is contacted and supported from above by the horizontal support wall surface 102 of the upper case 12. The rear surface of the base end portion of the second flat plate 90a is contacted and supported from below by the support flat surface 70a of the support base 64a of the lower case 14. Thus, the base end portion of the second flat plate 90a of the bus bar 18a is vertically held between the support flat surface 70a of the lower case 14 and the horizontal support wall surface 102 of the upper case 12. The bus bar 18a of the present embodiment is held as above and thus positioned in the vertical direction, which is a projecting direction of the support base 64a, and accordingly the connection terminal 24a is positioned in the projecting direction of the support base 64a.

As shown in FIG. 7, the front surface (right surface in FIG. 7) of the perpendicular portion 88a of the bus bar 18a is contacted and supported from the right side in FIG. 7 by the perpendicular portion support ribs 106 provided on the perpendicular support wall surface 104. The rear surface (left surface in FIG. 7) of the perpendicular portion 88a is contacted and supported from the left side in FIG. 7 by the side end support ribs 82 provided on the back surface 80 of the support base 64a. Thereby, the front end (upper) portion of the perpendicular portion 88a of the bus bar 18a is held horizontally (left-right direction in FIG. 7) between the side end support ribs 82 of the lower case 14 and the perpendicular portion support ribs 106 of the upper case 12. The bus bar 18a of the present embodiment, which is held between the support base 64a and the upper case 12 as described above, is thus positioned in the projecting direction of the connection terminal 24a. Accordingly, the connection terminal 24a of the present embodiment is positioned in the projecting direction of the connection terminal 24a in addition to the projecting direction of the support base 64a.

Although not shown in the drawing, the lower window 94 and the bottom window 98 are also provided in the tubular portion 38 of the connection housing 22b. The support base 64b on which the bus bar 18b is mounted of the lower case 14 is inserted from below to the window 108 composed of the lower window 94 and the bottom window 98. Thereby, the front end portion of the second flat plate 90b of the bus bar 18b projects inside the connection housing 22b to form the connection terminal 24b.

The connection housing 22b has a structure of interposing the bus bar 18b between the upper case 12 and the lower case 14 slightly different from that of the bus bar 18a. Specifically, as described above, the second flat plate 90b of the bus bar 18b is longer than the bus bar 18a, and only the intermediate portion in the length direction of the second flat surface 90b is mounted on the support flat surface 70b of the support base 64b of the lower case 14. With the bus bar 18b, only a portion of the intermediate portion in the length direction of the second flat surface 90b is thus vertically held between the support flat surface 70b of the lower case 14 and the connection housing 22b of the upper case 12.

In addition, the perpendicular portion 88b of the bus bar 18b is not overlapped on the back surface 84 of the support base 64b, and only the lower end side is overlapped on the housing wall 60 of the bus bar mounting portion 56, as described above. Although not shown in the drawing, the perpendicular portion support ribs 106 are provided in the bus bar 18b on the wall surface of the upper case 12 in positions to horizontally interpose the lower end side of the perpendicular portion 88b of the bus bar 18b overlapped on the housing wall 60. Thereby, the lower portion of the perpendicular portion 88b of the bus bar 18b is horizontally held between the housing wall 60 of the bus bar mounting portion 56 of the lower case 14 and the perpendicular portion support ribs 106 on the upper case 12. Specifically, the bus bar 18a was interposed in the vertical and horizontal directions of the bus bar 18a in the position adjacent to the connection housing 22a. The bus bar 18b, however, is interposed vertically in the position adjacent to the connection housing 22b and is interposed horizontally in the position slightly distant from the connection housing 22b.

As described above, the connection housings 22a and 22b open to the side of the upper case 12 are integrally provided in the upper case 12 in the electric junction box 10 of the present embodiment, thereby successfully securing the shape stability and connection stability of the connection housings 22a and 22b. Different from a conventional divided structure in which connection housings 22a and 22b straddles an upper case 12 and a lower case 14, the connection housings 22a and 22b are thus prevented from deforming due to displacement of the upper case 12 and the lower case 14. Thereby, instability is prevented between the connection housings 22a and 22b and connectors mounted therein, and the connectors are more stably held. Consequently, high connection stability can be achieved.

The connection housings 22a and 22b of the present embodiment are integrated with the upper case 12, not provided as separate members, thus preventing an increase in the number of components and providing the connection housings 22a and 22b in a compact size at a low cost. The upper case 12 integrally provided with the connection housings 22a and 22b open to the side is easily molded by inserting a slide to a mold of the upper case 12.

A portion of the bus bar 18a included in the connection terminal 24a of the connection housing 22a is provided along the support base 64a. In particular, the perpendicular portion 88a of the bus bar 18a is held between the support base 64a of the lower case 14 and the perpendicular support wall surface 104 of the upper case 12. Thus, even in the case of horizontally removing and inserting a connector from and into the connection housing 22a, insertion/removal force horizontally exerted on the bus bar 18a can be supported either by the lower case 14 or the upper case 12 in both removal and insertion directions. Thereby, the connection terminal 24a and the bus bar 18a can effectively be prevented from being deformed or displaced by an excessive insertion/removal force exerted on the bus bar 18a. In an electric component housing open to the side (horizontal direction), such as the connection housing 22a, an insertion/removal direction of an electric component is same as the extending direction of the bus bar 18a. It is thus difficult to provide a structure to support the insertion/removal force exerted on the connection terminal 24a and the bus bar 18a, for example, compared with a regular electric component housing open vertically on an upper surface of an upper case 12 or a lower surface of a lower case 14. According to the present embodiment, however, the vertically projecting support base 64a is suitably used to interpose and support the perpendicular portion 88a of the bus bar 18a between the support base and the perpendicular portion support ribs 106 of the upper case 12 on the two sides in the horizontal direction. Thus, the insertion/removal force exerted on the connection terminal 24a is securely supported by the upper case 12 and the lower case 14 to prevent deformation of the bus bar 18a. In particular, the bus bar 18a is interposed in the insertion/removal direction proximate to a mounting position of a connector, thus effectively preventing deflection and deformation of the bus bar 18a.

Furthermore, the bus bars 18a and 18b included in the connection terminals 24a and 24b, respectively, are held between the upper case 12 and the lower case 14 in the vertical direction in addition to the horizontal direction, which is the projecting direction of the connection terminals 24a and 24b, in the present embodiment. Specifically, the second flat plate 90a of the bus bar 18a is held between the support base 64a and the connection housing 22a in the projection direction of the support base 64a, namely, in the vertical direction. Thus, the connection terminals 24a and 24b are prevented from being displaced or deformed in the insertion direction in the connection housings 22a and 22b, respectively, thus achieving stable connection of connectors.

In addition, the window 108 in the connection housings 22a and 22b is provided in the middle portion of the lower wall 92 and the bottom wall 40 of the tubular portion 38, avoiding the corner 96 of the tubular portion 38. The rigidity of the connection housings 22a and 22ba as a whole is thus ensured due to the reinforcement effect of the corner 96 even when the window 108 is provided. Thereby, the shape stability of the connection housings 22a and 22b and eventually the connection stability of connectors are firmly ensured.

Figure 9:
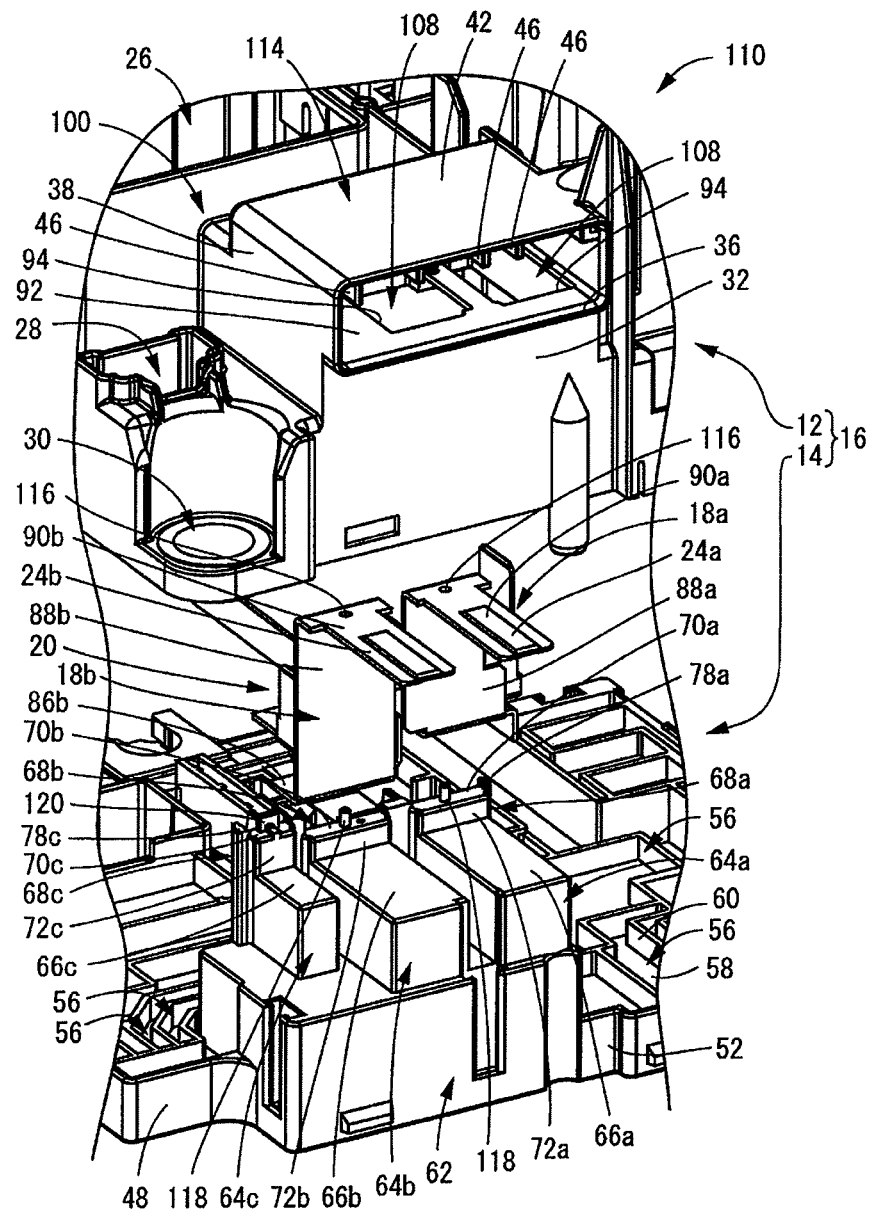
FIG. 9 is an exploded perspective view of a main portion of an electric junction box according to a second embodiment of the present invention.

FIG. 9 is an exploded perspective view of a main portion of an electric junction box 110 according to a second embodiment of the present invention. The electric junction box 110 has a substantially similar structure to the electric junction box 10 of the first embodiment, except for a structure of the main portion shown in FIG. 9. An entire view is thus omitted. In the explanations below, members and portions similarly structured to those in the first embodiment are assigned with the same reference numerals as those in the first embodiment in the drawings and explanations thereof are omitted appropriately. In FIG. 9, only two bus bars 18a and 18b are illustrated to clarify the drawing.

As shown in FIG. 9, a connection housing 114 open to a side of an upper case 12 is provided with a plurality of windows 108 in the electric junction box 110. An opening 36 of a tubular portion 38 in the connection housing 114 projects slightly outward from a peripheral wall 32 of the upper case 12.

In the bus bars 18a and 18b whose front end portions are housed in the connection housing 114, connection terminals 24a and 24b, respectively, are each provided with a circular through-hole 116 on a base end side.

A projection 62 of a lower case 14 is integrally provided with three support bases 64a, 64b, and 64c projecting toward the upper case 12 and facing inside the connection housing 114 through the respective plurality of windows 108 in the connection housing 114. Support flat surfaces 70a and 70b of the support bases 64a and 64b, respectively, on which the base end portions of the connection terminals 24a and 24b of the bus bars 18a and 18b, respectively, are mounted respectively, are each provided with a positioning projection 118 cylindrically extending in a projecting direction of the support bases 64a and 64b. A support flat surface 70c of the support base 64c is provided with a locking projection 120 projecting in a T shape from a planar view. The height of the locking projection 120 projecting from the support flat surface 70c varies in a stepped manner. The locking projection 120 projects slightly lower on the opening 36 side of the connection housing 114 and higher in a rectangular portion on the opposite side to the opening 36.

Figure 10:
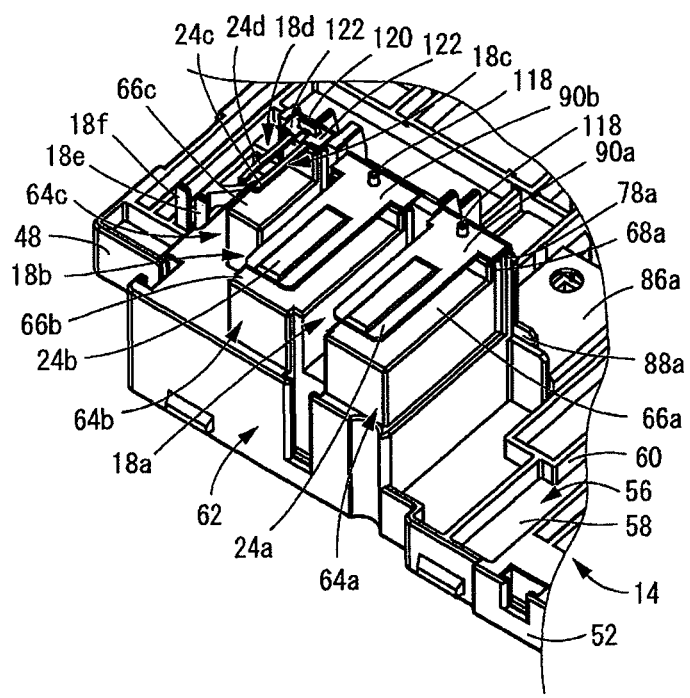
FIG. 10 is a perspective view of a main portion of a lower case and a bus bar shown in FIG. 9.

As shown in FIG. 10, the support bases 64a and 64b of the lower case 14 are provided with the bus bars 18a and 18b, respectively, therealong. The positioning projection 118 provided on each of the support bases 64a and 64b penetrates the through-hole 116 in each of the bus bars 18a and 18b and projects on the upper case 12 side. Thereby, each of the bus bars 18a and 18b is positioned horizontally along an entire periphery of the positioning projection 118.

The support base 64c is provided with two bus bars 18c and 18d therealong. Connection terminals 24c and 24d of the bus bars 18c and 18d, respectively, are each provided with a bending portion 122 on a base end side, the connection terminals 24c and 24d being mounted on the support flat surface 70c of the support base 64c, the bending portion 122 bending and extending to the side along an external peripheral surface shape of the locking projection 120. The external peripheral surface of the locking projection 120 and a side end surface of the bending portion 122 are engaged, and thereby the bus bars 18c and 18d are horizontally positioned.

As shown in FIG. 9, the upper case 12 is placed from above over the bus bars 18a, 18b, 18c, and 18d mounted on the support bases 64a, 64b, and 64c. Thereby, the front end portions of the bus bars 18a, 18b, 18c, and 18d are inserted into the connection housing 114 through the respective windows 108, and the support bases 64a, 64b, and 64c are disposed inside the respective windows 108. Thus, the connection housing 114 is provided having the plurality of connection terminals 24a, 24b, 24c, and 24d projecting inside.

Figure 11:
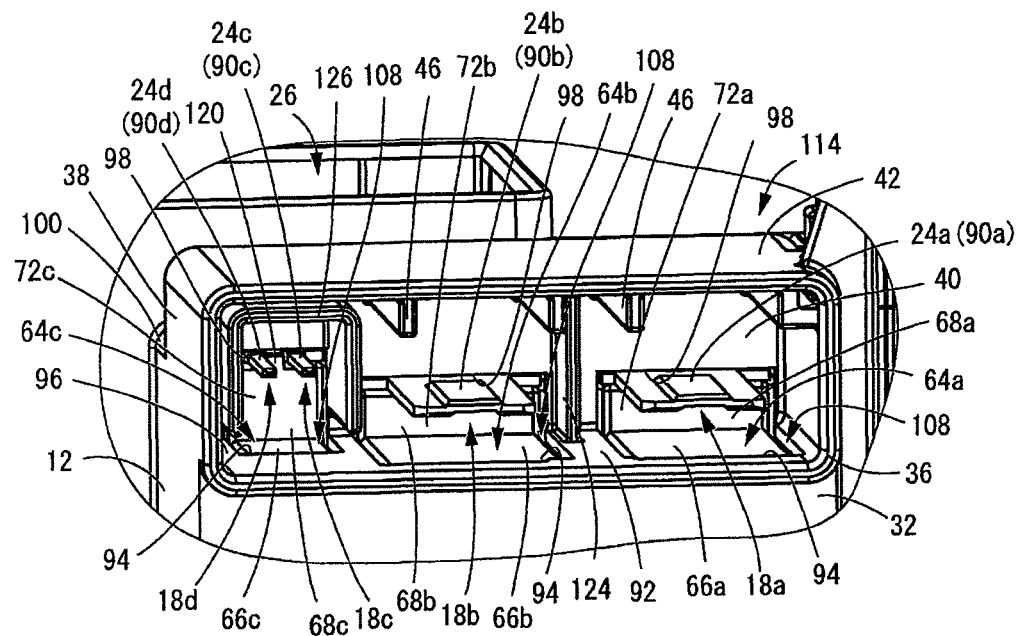
FIG. 11 is an enlarged perspective view of the main portion of the electric junction box shown in FIG. 9.
Figure 12:
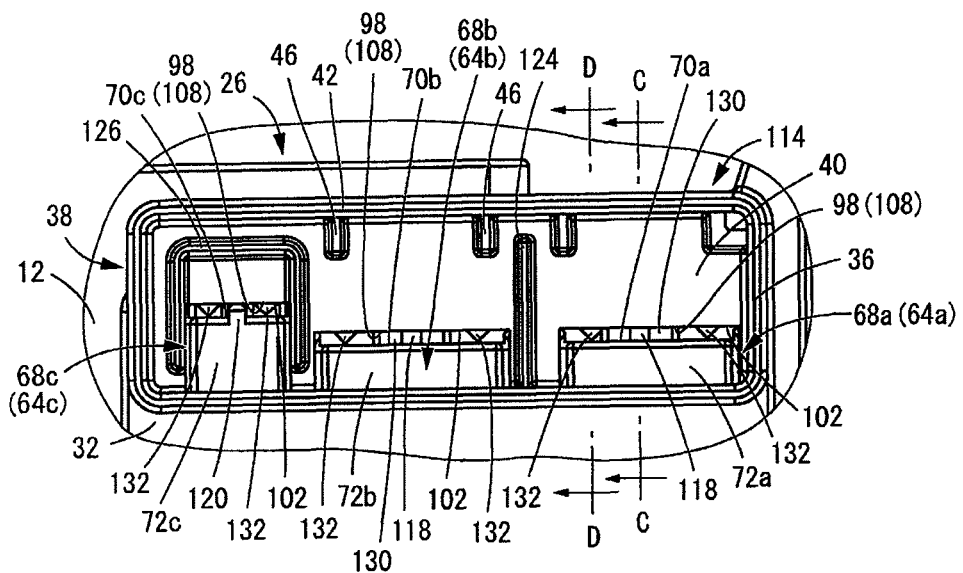

FIGS. 11 to 14 are enlarged views of the connection housing 114. In FIG. 12, only the upper case 12 and the lower case 14 are illustrated and the bus bars 18a, 18b, 18c, and 18d are omitted to clarify the drawing.

As shown in FIGS. 11 and 12, a partition wall 124 and a support wall portion 126 are provided, the partition wall 124 demarcating the connection terminal 24a from the connection terminal 24b, the support wall portion 126 surrounding the connection terminals 24c and 24d. The connection housing 114 is provided with the three windows 108, to which the support bases 64a, 64b, and 64c, respectively, are fitted.

Figure 13:
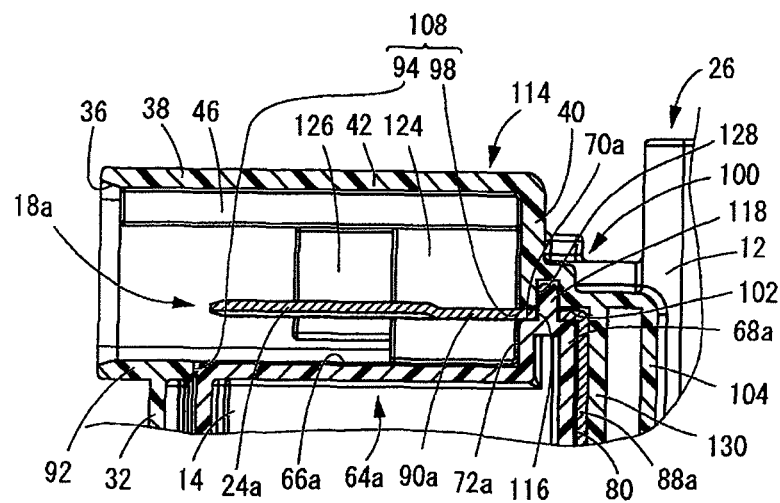
FIG. 13 is a cross-sectional view of the main portion in FIG. 12 along C-C.
Figure 14:
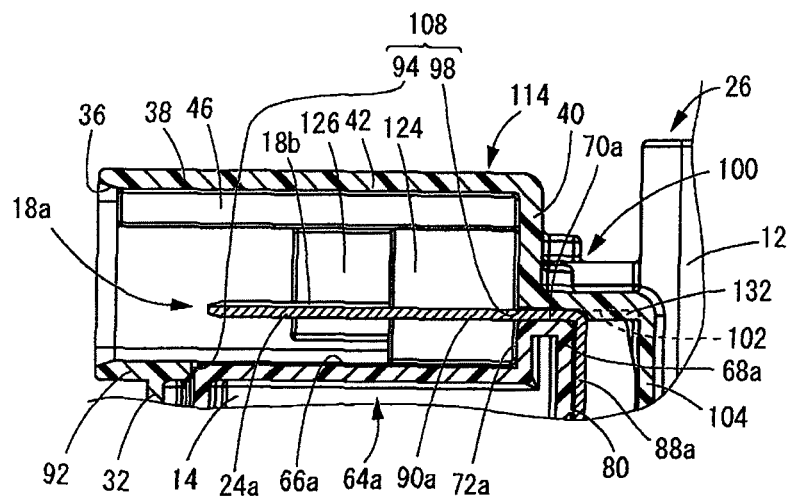
FIG. 14 is a cross-sectional view of the main portion in FIG. 12 along D-D.

The fitting of the windows 108 and the support bases 64a, 64b, and 64c is explained using the support base 64a shown in FIGS. 13 and 14 as an example. As shown in FIG. 13, the base end portion of the connection terminal 24a of the bus bar 18a is held between a housing portion 100 of the connection housing 114 and the support flat surface 70a of the support base 64a in a projecting direction of the support base 64a. The positioning projection 118 on the support flat surface 70a of the support base 64a penetrates the through-hole 16 in the bus bar 18a and projects on the upper case 12 side. A projecting end portion of the positioning projection 118 is fitted to a fitting recess 128 provided in the housing portion 100 of the connection housing 114. The fitting recess 128 and the positioning projection 118 are fitted as above, and thus the connection housing 114 and the support base 64a are horizontally positioned to each other. Specifically, in the present embodiment, the positioning projection 118 penetrates the through-hole 116 of the bus bar 18a and is fitted to the fitting recess 128. Thereby, the bus bar 18a and the lower case 14 are mutually positioned, and concurrently the upper case 12 and the lower case 14 are positioned.

A perpendicular portion support projection 130 is provided in the present embodiment, the perpendicular portion support projection 130 having a wider area than the perpendicular portion support rib 106 in the first embodiment and projecting toward a perpendicular portion 88a of the bus bar 18a (detailed illustration of the entire portion omitted). As shown in FIG. 13, the perpendicular portion 88a of the bus bar 18a is thus held in a sufficient area in the horizontal direction (left-right direction in FIG. 13) between a back surface 80 of the support base 64a on the lower case 14 side and the perpendicular portion support projection 130 on the upper case 12 side. Accordingly, the strength to support the bus bar 18a in the horizontal direction is enhanced.

As shown in FIGS. 12 and 14, the connection housing 114 of the present embodiment is provided with a plurality of press-fit ribs 132 extending from a back side (bottom side) of the housing portion 100 of the connection housing 114 toward the opening 36 side of the connection housing 114. The press-fit ribs 132 are provided on a horizontal support wall surface 102 of the housing portion 100 of the connection housing 114 in a pair facing each of the support flat surface 70a, 70b, and 70c of the support bases 64a, 64b, and 64c, respectively. As shown in FIG. 12, the press-fit ribs 132 each have a triangular cross-sectional shape projecting toward the support flat surface 70a, 70b, and 70c of the support bases 64a, 64b, and 64c, respectively.

The upper case 12 is placed from above the bus bar 18a onto the lower case 14, and thus the press-fit ribs 132 are press-fitted to upper surfaces of the bus bars 18a, 18b, 18c, and 18d. More specifically, in the support base 64a shown in FIG. 14, for instance, the base end portion of the connection terminal 24a of the bus bar 18a is in contact from above with a portion on the opening 36 side of the press-fit ribs 132, which are thus press-fitted in an elastically deformed state. Thereby, the bus bar 18a is held between the press-fit ribs 132 of the connection housing 114 and the support flat surface 70a of the support base 64a.

The bus bar 18b and the support base 64b of the present embodiment have substantially similar structures to the above-described bus bar 18a and the support base 64a, and thus detailed explanations are omitted. Furthermore, the bus bars 18c and 18d are also held between the support base 64c and the housing portion 100 of the connection housing 114 in a substantially similar manner to the above-described bus bar 18a (details not shown in the drawing). In lieu of the positioning projection 118, the locking projection 120 is provided on the support base 64c. A projecting end portion of the locking projection 120 is also housed and fitted into a fitting hole (not shown in the drawing) in the housing portion 100 of the connection housing 114. Thus, the support base 64c and the connection housing 114 are horizontally positioned. Specifically, an external peripheral surface of the locking projection 120 and the bending portion 122 of each of the bus bars 18c and 18d are engaged in the support base 64c as well, and thereby the bus bars 18c and 18d and the lower case 14 are horizontally positioned. Furthermore, the projecting end portion of the locking projection 120 and the fitting hole (not shown in the drawing) are fitted, and thereby the upper case 12 and the lower case 14 are horizontally positioned. As shown in FIG. 12, the bus bars 18c and 18d are each press-fitted by one press-fit rib 132 in the support base 64c.

As described above, in the electric junction box 110 having the structure according to the present embodiment, the positioning projection 118 on the support bases 64a and 64b is engaged with the through-hole 116 in the bus bars 18a and 18b. Thus, the bus bars 18a and 18b are positioned and held in the horizontal direction of the positioning projection 118. The projecting end portion of positioning projection 118 is fitted to the fitting recess 128 in the connection housing 114 in a state where the base end portion penetrates the through-hole 116. Consequently, each positioning projection 118 concurrently performs horizontal positioning of the bus bar 18a, 18b interposed between the connection housing 114 and the support base 64a, 64b and horizontal positioning between the connection housing 114 and the support base 64a, 64b.

Thus, even in the case where the plurality of connection terminals 24a, 24b, 24c, and 24d are disposed in one connection housing 114 open to the side, the connection terminals 24a, 24b, 24c, and 24d can be positioned at sufficient accuracy in the electric junction box 110 according to the present embodiment. Accordingly, workability in mounting connectors (not shown in the drawing) in the connection housing 114 and connection stability between the connection terminals 24a, 24b, 24c, and 24d and the connectors can effectively be improved.

Furthermore, the positioning projection 118 extends in the projecting direction of the support bases 64a and 64b, namely, the direction orthogonal to the projecting direction of the connection terminals 24a and 24b according to the present embodiment. Thus, even in the case where the insertion/removal force is exerted horizontally to the connection terminals 24a and 24b in the connecting housing 114 open to the side, the positioning projection 118 can stably hold the bus bars 18a and 18b.

In the present embodiment, the press-fit ribs 132 project on the connection housing 114. The bus bars 18a, 18b, 18c, and 18d are each press-fitted by the press-fit ribs 132, and are held between the connection housing 114 and the respective support bases 64a, 64b, and 64c. Thus, the size tolerance of the bus bars 18a, 18b, 18c and 18d and the support bases 64a, 64b, and 64c is absorbed, and thereby the bus bars 18a, 18b, 18c, and 18d are stably held between the connection housing 114 and the support bases 64a, 64b, and 64c without shakiness. Accordingly, the bus bars 18a, 18b, 18c, and 18d can be positioned at higher accuracy.

Some embodiments of the present invention were explained in detail. The present invention, however, is not limited to the specific descriptions therein. In the first and second embodiments, for example, the connection housings 22a, 22b, and 114 are connector housings in which connectors are mounted. However, the connection housings 22a, 22b, and 114 may be known fuses or relays in which electric components are mounted. Furthermore, the connection terminals 24a, 24b, 24c, and 24d provided in the connection housings 22a, 22b, and 114 are not limited to tab terminals. Any known terminal shape, such as a tuning-fork terminal, may be employed.

In the first and second embodiments, the window 108 is open in the lower wall 92 and the bottom wall 40 of the tubular portion 38. The window 108, however, is not particularly limited to a specific mode, provided that the window 108 can appropriately support the bus bar 18 between the upper case 12 and the support base 64. For instance, the window 108 may be provided open only in the lower wall 92 of the connection housing 22, and the support base 64 may project inside the window 108 from the lower case 14 side. Then, the perpendicular portion 88 of the bus bar 18 may be interposed from horizontal two sides between the back surface 80 of the support base 64 and the bottom wall 40 of the connection housing 22 or 114.

The window 108 of the first and second embodiments has a structure in which the openings in the lower wall 92 and the bottom wall 40 of the tubular portion 38 are both closed by the support base 64. The window 108 is not necessarily completely covered by the support base 64. A step or gap may be provided between the support base 64 and the window 108. Specifically, in the support base 64a, for example, only the bottom window 98 of the window 108 may be covered by the holding projection 68 of the support base 64a, and the bus bar 18a may be interposed between the connection housing 22a and the support base 64a. In the state where the bus bar 18 is held as above, the lower window 94 of the window 108 may be open without being covered by the flat surface 66 of the support base 64b. Alternatively, the stepped surface 72a of the holding projection 68 may be positioned more inside than the bottom wall 40 of the connection housing 22a so that the bottom window 98 is open in a stepped manner. This configuration prevents a defect, such as an interference of the support base 64 with a connector in the case where the support base 64 excessively projects toward the internal peripheral surface of the tubular portion 38 due to displacement between the lower case 14 and the upper case 12. In the case where the window 108 is not covered by the support base 64, leaving an entire or portion thereof open as above, it is desired that the periphery of the window 108 be reinforced by the corner 96 and the like.

In the electric junction box main body 16 of the first and second embodiments, the upper case 12 as the first case and the lower case 14 as the second case are perpendicularly combined in the vertical direction, and the connection housings 22a, 22b, and 114 are horizontally open on the side of the upper case 12. The opening direction of the connection housings 22 and 114 of the present invention is not particularly limited. The connection housings 22 and 114 may be open in any direction orthogonal to the combining direction of the first case and the second case. For example, the first case and the second case may be horizontally combined with each other, and the connection housings 22 and 114 may be open in the first case in the upward or downward direction.

The connection housings 22a and 22b of the first embodiment are both open directly in the wall surface of the peripheral wall 32 of the upper case 12. Similar to the connection housing 114 of the second embodiment, a portion of the tubular portion 38 of the connection housing 22 may project to the side from the peripheral wall 32 of the upper case 12. Alternatively, a substantially entire tubular portion 38 of the connection housing 22 may project to the side of the upper case 12, and the window 108 may be provided in the bottom wall 40 of the tubular portion 38 so that the window 108 is covered by the support base 64.

In the second embodiment, the specific shape, position, and number of the positioning projection 118 on each of the support bases 64a and 64b and of the fitting recess 128 in the connection housing 114 are not particularly limited, provided the support bases 64a and 64b and the connection housing 114 can be fitted to each other. For instance, the positioning projection 118 may be provided on the connection housing 114 and the fitting recess 128 may be provided in each of the support bases 64a and 64b. Alternatively, the positioning projection 118 may be provided on each of the support bases 64a and 64b and the connection housing 114, and the fitting recess 128 may be provided in each of the support bases 64a and 64b and the connection housing 114.

Furthermore, the specific shape, position, and number of the press-fit ribs 132 are not particularly limited, either. For example, of the connection housing 114 and the support bases 64a, 64b, 64c, and 64d that interpose the bus bars 18a, 18b, 18c, and 18d, respectively, in the second embodiment, the press-fit ribs 132 may project from the support bases 64a, 64b, 64c, and 64d. Alternatively, the press-fit ribs 132 may be provided on both the connection housing 114 and the support bases 64a, 64b, 64c, and 64d.

The press-fit ribs 132, the positioning projection 118, and the fitting recess 128 of the second embodiment may be provided not only to the connection housing 114 in which the plurality of bus bars 18a, 18b, 18c, and 18d are disposed as in the second embodiment, but also to the connection housings 22a and 22b in which the single bus bar 18 is disposed as in the connection housing 22 of the first embodiment. Providing the press-fit ribs 132, the positioning projection 118, and the fitting recess 128 can improve positioning accuracy of the bus bar 18.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. An electric junction box comprising:
an electric junction box main body composed of a first case and a second case combined with each other, and including a connection housing open to a side of the electric junction box main body orthogonal to a combining direction of the first case and the second case, the connection housing configured to receive a connector inserted inside the connection housing from an opening of the connection housing; and
a bus bar housed in the electric junction box main body, and including a connection terminal integrally provided with the bus bar, the connection terminal disposed in the connection housing and projecting toward an opening direction of the connection housing, wherein
the first case is integrally provided with the connection housing open to the side of the first case;
the second case is integrally provided with a support base projecting toward the first case and facing inside the connection housing from a window provided in the connection housing; and
the bus bar included in the connection terminal disposed inside the connection housing is provided along the support base and includes a perpendicular portion which extends orthogonally to a projecting direction of the connection terminal, wherein the perpendicular portion of the bus bar is interposed between the support base and the first case, to be positioned along the projecting direction of the connection terminal, and a flat plate portion of the bus bar that extends parallel to the projecting direction is interposed between the support base and the first case to be positioned along a perpendicular direction orthogonal to the projecting direction of the connection terminal.

2. The electric junction box according to claim 1, wherein
the support base projects inside the connection housing on a bottom side opposite to the opening side of the connection housing; and
the bus bar is interposed between the connection housing and the support base in the connection housing, such that the connection terminal is positioned in the projecting direction of the connection terminal and the projecting direction of the support base.

3. The electric junction box according to claim 2, wherein the bus bar is interposed between the connection housing and the support base in the projecting direction of the support base; one of the connection housing and the support base being provided with a positioning projection extending in the projecting direction of the support base; the positioning projection penetrating a through-hole in the bus bar; and a projecting end portion of the positioning projection being fitted to a fitting recess provided in the other of the connection housing and the support base.

4. The electric junction box according to claim 2, wherein at least one of the connection housing and the support base interposing the bus bar is provided with a press-fit rib; and the press-fit rib is press-fitted to the bus bar and the bus bar is held between the connection housing and the support base.

5. The electric junction box according to claim 3, wherein at least one of the connection housing and the support base interposing the bus bar is provided with a press-fit rib; and the press-fit rib is press-fitted to the bus bar and the bus bar is held between the connection housing and the support base.

6. The electric junction box according to claim 1, wherein the connection housing has a rectangular tubular portion open to the side; and the window is provided in a position spaced from a corner of the tubular portion.

7. The electric junction box according to claim 2, wherein the connection housing has a rectangular tubular portion open to the side; and the window is provided in a position spaced from a corner of the tubular portion.

8. The electric junction box according to claim 3, wherein the connection housing has a rectangular tubular portion open to the side; and the window is provided in a position spaced from a corner of the tubular portion.

9. The electric junction box according to claim 4, wherein the connection housing has a rectangular tubular portion open to the side; and the window is provided in a position spaced from a corner of the tubular portion.

10. The electric junction box according to claim 5, wherein the connection housing has a rectangular tubular portion open to the side; and the window is provided in a position spaced from a corner of the tubular portion.

* * * * *